(12) United States Patent
Yao et al.

(10) Patent No.: US 8,937,377 B2
(45) Date of Patent: Jan. 20, 2015

(54) PACKAGE-ON-PACKAGE PROXIMITY SENSOR MODULE

(75) Inventors: Yufeng Yao, Singapore (SG); Chi Boon Ong, Singapore (SG); Chee Heng Wong, Singapore (SG)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 458 days.

(21) Appl. No.: 12/901,037

(22) Filed: Oct. 8, 2010

(65) Prior Publication Data

US 2012/0086018 A1 Apr. 12, 2012

(51) Int. Cl.
*H01L 31/167* (2006.01)
*H01L 31/0203* (2014.01)
*G01S 7/481* (2006.01)
*H01L 31/0232* (2014.01)

(52) U.S. Cl.
CPC ............ *H01L 31/0203* (2013.01); *G01S 7/4813* (2013.01); *H01L 31/02325* (2013.01); *H01L 2224/48137* (2013.01); *H01L 2224/48247* (2013.01); *H01L 2224/48091* (2013.01); *H01L 2224/48465* (2013.01)
USPC .............. 257/676; 257/82; 257/684; 257/687; 257/688; 257/723; 257/724

(58) Field of Classification Search
USPC ............ 257/82, 684, 687, 688, 723, 724, 676
See application file for complete search history.

(56) References Cited

U.S. PATENT DOCUMENTS

| | | | | |
|---|---|---|---|---|
| 4,309,605 A * | 1/1982 | Okabe | ........................ | 250/239 |
| 5,506,445 A | 4/1996 | Rosenberg | | |
| 7,309,855 B2 * | 12/2007 | Nagasaka et al. | ........ | 250/231.14 |
| 7,842,957 B2 * | 11/2010 | Goh et al. | ........................ | 257/82 |
| 8,030,742 B2 * | 10/2011 | Lim et al. | ........................ | 257/666 |
| 8,053,800 B2 * | 11/2011 | Horio | ........................ | 257/98 |
| 8,492,720 B2 * | 7/2013 | Yao et al. | ........................ | 250/338.4 |
| 2001/0035573 A1 * | 11/2001 | Weigert | ........................ | 257/680 |
| 2003/0173561 A1 | 9/2003 | Sieben et al. | | |
| 2003/0186482 A1 * | 10/2003 | Schuurmans et al. | ........ | 438/106 |
| 2006/0016994 A1 * | 1/2006 | Basoor et al. | ........................ | 250/338.1 |
| 2006/0237540 A1 * | 10/2006 | Saxena et al. | ........................ | 235/454 |
| 2008/0011940 A1 * | 1/2008 | Zhang et al. | ........................ | 250/214 AL |
| 2008/0049210 A1 * | 2/2008 | Takaoka | ........................ | 356/3 |
| 2008/0219673 A1 * | 9/2008 | Goh et al. | ........................ | 398/135 |
| 2008/0296478 A1 * | 12/2008 | Hernoult | ........................ | 250/216 |
| 2009/0027652 A1 * | 1/2009 | Chang et al. | ........................ | 356/4.01 |
| 2009/0097010 A1 | 4/2009 | Yamaguchi | | |
| 2009/0159900 A1 * | 6/2009 | Basoor et al. | ........................ | 257/82 |
| 2010/0110413 A1 | 5/2010 | Liu | | |

* cited by examiner

Primary Examiner — Eugene Lee (57) ABSTRACT

A package-on-package proximity sensor module including a infrared transmitter package and a infrared receiver package is presented. The proximity sensor module may include a fully-assembled infrared transmitter package and a fully-assembled infrared receiver package disposed on a quad flat pack no-lead (QFN) lead frame molded with an IR cut compound housing. A bottom surface of the QFN lead frame may be etched and covered with the IR cut compound to provide a locking feature between the QFN lead frame and the IR cut compound housing.

20 Claims, 8 Drawing Sheets

Half-etched lead frame

PACKAGE-ON-PACKAGE PROXIMITY SENSOR MODULE

BACKGROUND

Proximity sensors are used to detect the presence of an object without physical contact. For example, proximity sensors are implemented in switches to open and close an electrical circuit when they make contact with or come within a certain distance of an object. These sensors are most commonly used in manufacturing equipment, robotics and security systems. For example, in a production assembly line, a proximity sensor may be used to measure the position of a machine component. Whereas in robotics, the proximity sensor may be used to monitor a robot position in relation to an object or a place and use the information to steer the robot accordingly. In another common example, a proximity sensor is often used with a water faucet to automatically turn on and off the water when a person's hands are held within a predetermined distance of the water faucet.

In general, a proximity sensor may include an invisible light source and a photo detector. When an object comes within a predetermined distance of the proximity sensor, the object reflects the light from the light source to the photo detector. After sensing the light reflected by the object, the photo detector then sends an output signal indicating the presence of an object. Typically, an action is performed in response to the output signal, such as turning on the water faucet, turning on hand dryer, etc.

More recently, the proximity sensor has been widely adopted in automation equipment and on many small portable devices, such as cell phones, PDAs, etc. that accept integrated circuit packages with small footprints. Accordingly, the overall package size of proximity sensors must also become smaller. As the proximity sensors become smaller, it has become increasingly complex to manufacture these sensors in a mass production environment, which has resulted in high production costs. Therefore, a lighter weight and smaller profile proximity sensor that can be manufactured easily and inexpensively, while maintaining product performance and reliability is desirable.

BRIEF DESCRIPTION OF THE DRAWINGS

Throughout the description and figures, similar reference numbers may be used to identify similar elements.

DETAILED DESCRIPTION

Figure 1A:
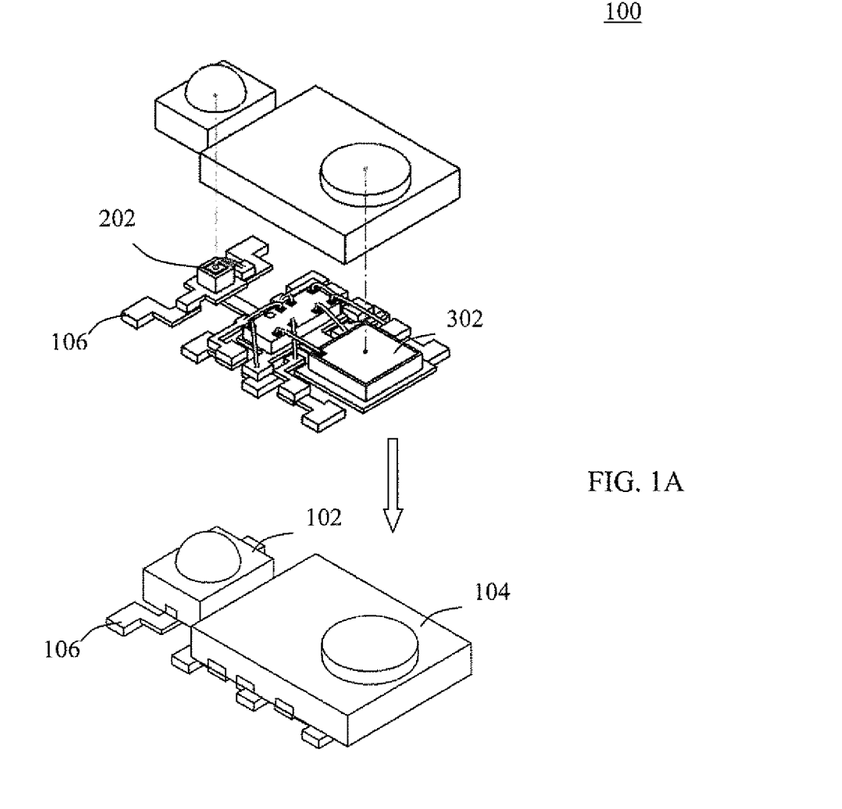
FIG. 1A illustrates a top perspective view of a partially completed package-on-package proximity sensor module.
Figure 1B:
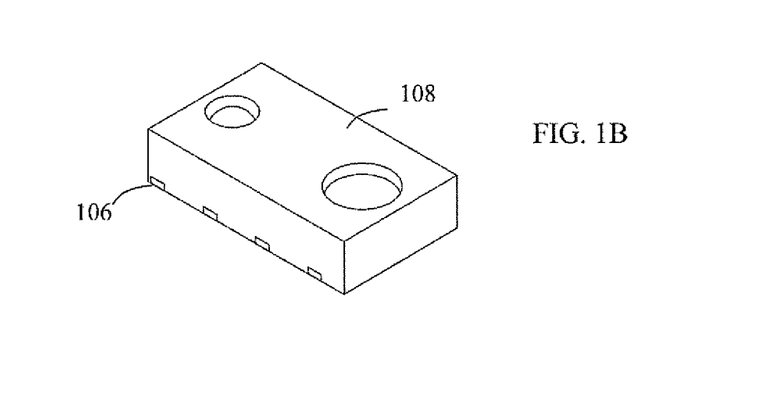
FIG. 1B illustrates a top perspective view of a completed package-on-package proximity sensor module.

FIGS. 1A and 1B illustrate a top perspective view of a package-on-package proximity sensor module 100. The illustrated proximity sensor module 100 may include an infrared transmitter package 102, a infrared receiver package 104, and a half-etched lead frame 106. There may also be an IR cut mold compound 108 covering the infrared transmitter package 102, the infrared receiver package 104, and a portion of the half-etched lead frame 106. Although certain component parts are shown in conjunction with proximity sensor module 100 of FIGS. 1A-1B, other embodiments may include fewer or more component parts or equivalent parts to provide fewer or more functions. For example, some embodiments of the proximity sensor module 100 may include an additional built-in signal conditioning feature, such as signal amplification or signal filtering to enhance the system performance. In another example, if the proximity sensor module 100 is adapted to be in a portable device for use in a bright environment, it may also be incorporated with additional sunlight and ambient light immunity features to improve the overall system performance when used in brightly lit or sunny outdoor conditions.

In one embodiment as illustrated in FIGS. 1A-1B, the proximity sensor module 100 is a package-on-package system. In particular, the proximity sensor module 100 may include a fully assembled infrared transmitter package 102, a fully assembled infrared receiver package 104, wherein both infrared transmitter package 102 and the infrared receiver package 104 may be disposed on a half-etched lead frame 106 and covered by an IR cut mold compound 108 to minimize the optical cross talk and interference between the infrared transmitter package 102 and the infrared receiver package 104. The IR cut mold compound 108 is configured to substantially attenuate or block the transmission of undesired reflected or direct infrared light that might otherwise propagate between the infrared transmitter package 102 and the infrared receiver package 104. In one embodiment, the infrared transmitter package 102 may emit electromagnetic radiation. When there is an object placed nearby, the object may reflect the electromagnetic radiation emitted from the infrared transmitter package 102 towards the infrared receiver package 104. The infrared receiver package 104 may detect the reflected electromagnetic radiation and subsequently convert the detected electromagnetic radiation into an output signal indicating the presence of an object.

Figure 2A:
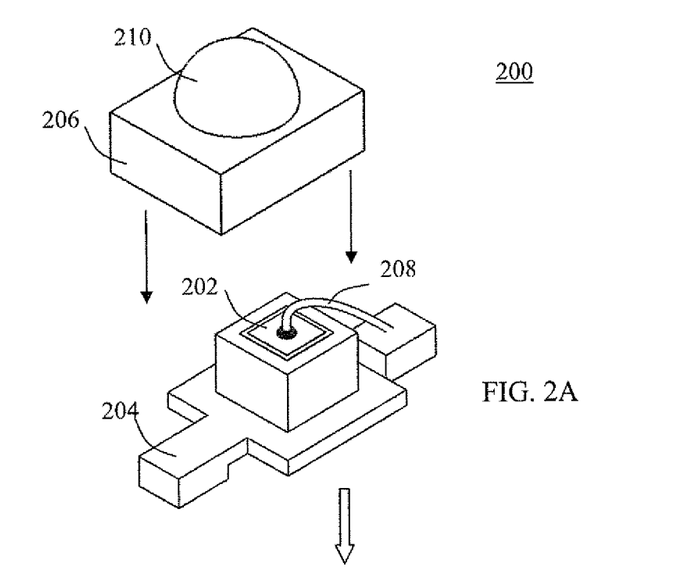
FIG. 2A illustrates a top perspective view of a partially completed infrared transmitter device package.
Figure 2B:
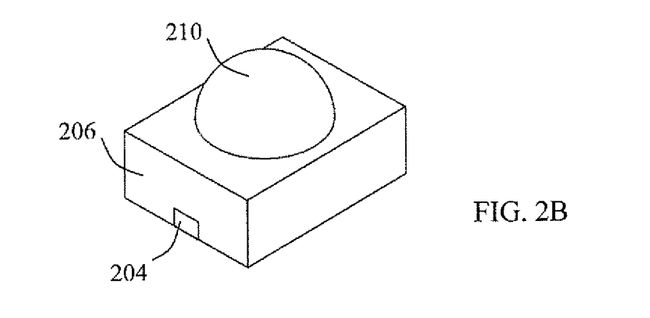
FIG. 2B illustrates a top perspective view of a completed infrared transmitter device package.

The infrared transmitter package 102 may be a fully assembled package disposed on a first portion of the half-etched lead frame 106 of the proximity sensor module 100. As illustrated in FIGS. 2A-2B, the fully assembled infrared transmitter package 200 may include any known proximity sensor light source, such as an infrared light emitting diode (hereinafter LED) die 202, disposed on a half-etched LED lead frame 204 and covered by a transparent compound 206 such as a epoxy resin which is transparent to infrared light. The LED die 202 may be electrically connected to the LED lead frame 204 by means of one or more wire bonds 208. The infrared transmitter package 200 may further include a lens 210 located over the LED die 202, such that a portion of the light emitted by the LED die 202 passes through the lens 210 and is directed towards the object to be detected. The lens 210 may be formed of the same material and simultaneously, under the same molding process when the infrared transmitter package 200 is molded with the transparent compound 206.

Figure 3A:
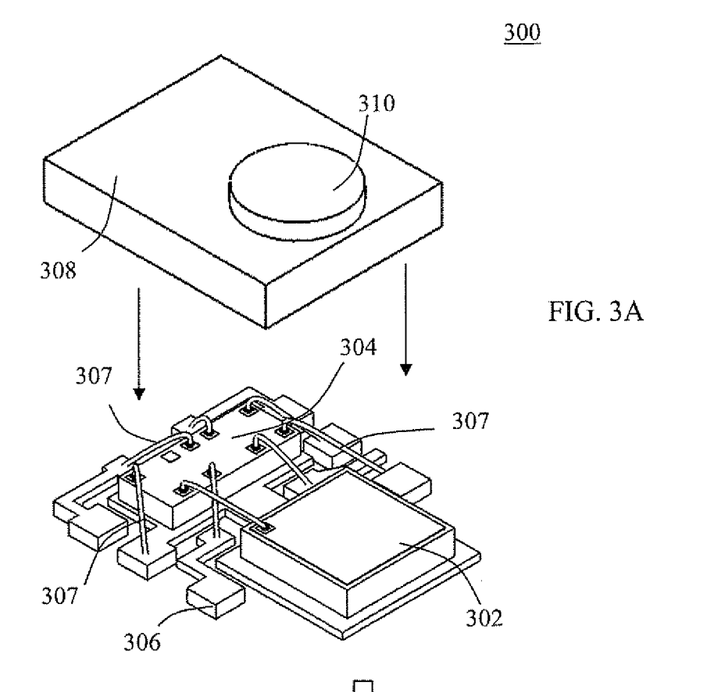
FIG. 3A illustrates a top perspective view of a partially completed infrared receiver device package.
Figure 3B:
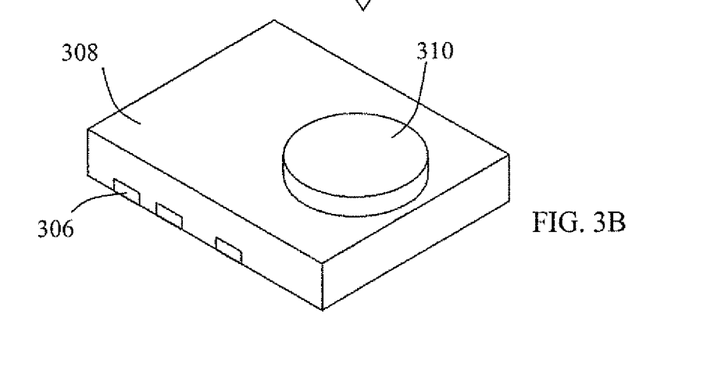
FIG. 3B illustrates a top perspective view of a completed infrared receiver device package.

The infrared receiver package 104 may be a fully assembled package disposed on a second portion of the half-etched lead frame 106 of the proximity sensor module 100. As illustrated in FIGS. 3A-3B, the infrared receiver package 300 may include any proximity sensor detecting means, such as a PIN diode, a phototransistor, or a photo-diode (hereinafter photo-diode) 302 and an application specific integrated circuit (hereinafter ASIC) chip 304 disposed on a half-etch infrared receiver lead frame 306 and covered by a transparent compound 308, which is the same transparent compound used for covering the LED die 208. The photo-diode 302 and the ASIC chip 304 may be electrically connected to each other and to the infrared receiver package lead frame 306 by a plurality of wire bonds 307. The illustrated infrared receiver package 300 may further include a lens 310 located over the photo-diode 302, such that a portion of the light reflected by an object in close proximity to the proximity sensor module 100 passes through the lens 310 and is directed towards the photo-diode 302. The lens 310 may be formed using the same material, and simultaneously, under the same molding process when the infrared receiver package 300 is molded with transparent compound 308.

According to one embodiment, the application specific integrated circuit (ASIC) chip 304 may be a signal conditioning IC configured for use with an optical proximity sensor for a specific application such as an Avago Technologies APDS-9702 which is known in the art. The ASIC chip may be wire bonded to the photo-diode 302 and the half-etch infrared receiver lead frame 306.

As the LED die 202, the photo-diode 302, the transparent compound 206 for the LED package 102, the transparent compound 308 for the infrared receiver package 104 and the IR cut mold compound 108 are well known in the art, for simplicity reasons, the functions, materials and manufacturing process of these components would not be elaborated extensively in this application. In one exemplary embodiment, the transparent compound 206 may be molded over the LED die 202 by a conventional injection molding process. However, other molding processes may also be used. In another example, the infrared LED die 202 may be manufactured by TYNTEK having a model number TK116IRA. The infrared photo-diode 302 may be manufactured by TYNTEK having a model number TK043PD. Similarly, the transparent compound 206 and 308, for example, may be manufactured by Nitto Denko having a part number NT8506. However, other transparent compounds such as transparent epoxy resin may also be used. The IR cut mold compound 108 may be manufactured by NITTO DENKO having a model number NT-MB-IRL3801 two-part epoxy resin material, NITTO DENKO™ NT8570 material, or PENCHEM Technologies™ OP 580 infrared filter optoelectronic epoxy. However, other suitable infrared non-transmissive epoxies, plastics, polymers or other materials may also be employed.

Figure 4:
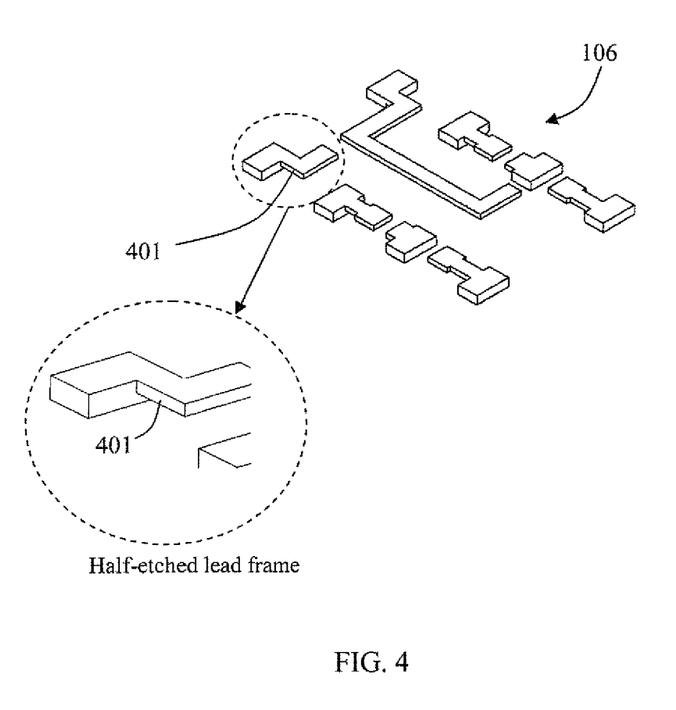
FIG. 4 illustrates a top perspective view of a half-etched lead frame.
Figure 5:
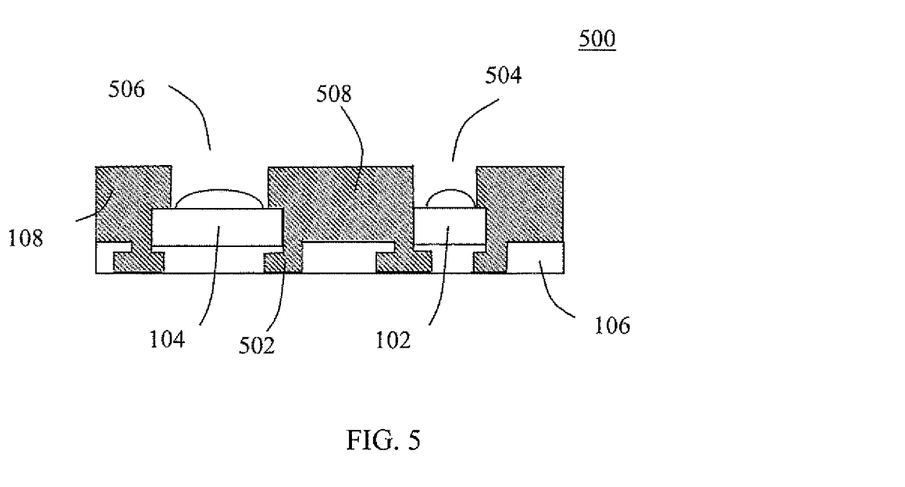
FIG. 5 illustrates a side cut-away view of a proximity sensor module.

FIG. 4 and FIG. 5 illustrate a top perspective view of the half-etched lead frame 106 and a side cut-away view of a proximity sensor module 100 that is similar to the previously described embodiment of FIG. 1. The proximity sensor module 100 of FIG. 5 includes a fully assembled infrared transmitter package 102 and a fully assembled infrared receiver package 104 disposed on a half-etched lead frame 106 and covered by an IR cut mold compound 108. In one embodiment, as shown in FIG. 4, the half-etched lead frame 106 may be a quad flat pack no-lead (QFN) lead frame, such as a Copper QFN lead frame. In another embodiment, the etched region 401 of the lead frame 106 may be covered with IR cut mold compound 108 to provide a locking feature (shown on FIG. 5 as element 502). One or more etched regions 401 may be formed on the lead frame 106 providing locking features 502 between the lead frame 106 and the IR cut mold compound 108, in order to facilitate the integrity of proximity sensor package, securing the lead frame 106, the IR cut mold compound 108, infrared transmitter package 102 and infrared receiver package 104. The infrared transmitter package 102 and the infrared receiver package 104 may be operably mounted to the lead frame 106 by means of solder ball and bump techniques using a chip surface mounting machine or a soldering machine. The chip surface mounting technology has been widely adopted in many automated chip manufacturing assembly lines and is particularly known to be an efficient and low cost process. However, another means of establishing electrical connections between a package and a lead frame, such as a wire bonding or conventional soldering process, may also be employed.

In another embodiment, the proximity sensor module 100 may include an IR cut mold compound 108, wherein the IR cut mold compound 108 is disposed over and covering both the infrared transmitter package 102 and the infrared receiver package 104 by any known molding process. The IR cut mold compound 108 may include a first aperture 504 above the infrared transmitter package 102 and a second aperture 506 over the infrared receiver package 104, respectively. The light emitted by the infrared transmitter package 102 may pass through the first aperture 504 towards the object (not shown) to be detected. Once the light is reflected by an object (not shown) in close proximity with the proximity sensor module 100, it may subsequently pass through the second aperture 506 towards the infrared receiver package 104, where it may be detected. After the reflected light is detected, an output signal may be transmitted by the infrared receiver package 104.

In general, the IR cut mold compound 108 may include a moldable material such as an epoxy or polymers added with and IR cut materials which may absorb or filter infrared light. For example, the IR cut material may attenuate electromagnetic radiation in the frequency range of 700-1200 nanometers, which is the wavelength of the infrared. The IR cut mold compound 108 may minimize the optical cross talk and interference between the infrared transmitter package 102 and the infrared receiver package 104. In one embodiment, the molding process may include a transfer molding process, casting or any other suitable methods and processes may also be employed to perform the same.

The embodiments described above and with reference to FIGS. 1-5 may provide an effective means for fabricating a low profile, small footprint, package-on-package, proximity sensor module 100. The implementation of the package-on-package structure has minimized, if not completely eliminated, many potential product defects, which are normally associated with or inherent in a typical package fabrication process. For example, when both the infrared transmitter package 102 and the infrared receiver package 104 have been fully assembled and molded prior to being disposed on the lead frame, than both the infrared transmitter and the photo-detector IC components within each package 102 and 104 are inevitably protected by their individual molded packages against any physical damage during the final packaging steps. In one embodiment, the proximity sensor module 100 may withstand damages, such as wire de-bonding, physical and chemical damage, which could be induced during the final manufacturing processes. In another exemplary embodiment, the fully assembled sub-packages 102 and 104 may be less susceptible to heat damage during final processing, since they may be electrically connected and attached to the lead frame by external solder bumps via a surface mounting process, rather than a solder flow process. Surface mount technology is known to generate less heat compared to a typical solder flow process. Therefore, any post fabrication damage, such as die delamination and package warpage that could be induced by solder reflow may be avoided by the embodiments discussed herein.

In one embodiment, the demand for a low cost and a smaller package profile may also be satisfied. For example, since the fabrication of the proximity sensor module 100 involves only the mounting of the packages on to the lead frame and the subsequent molding process, the cost of manufacturing is relatively low. Furthermore, a simpler fabrication process may contribute to a higher production yield, which may result in reduced overall manufacturing cost. As the fabrication of the proximity sensor module 100 may involve only the integration of the infrared transmitter package 102 and the infrared receiver package 104 adjacent to each other on to the lead frame 106, followed by a molding process, the overall size of the sensor module 100 may be determined by the combined size and form factors of both packages. Apart from the additional height contributed by the solder bump, in some cases, the height of a proximity sensor module 100 may be substantially the same as the height of the packages 102 and 104 mounted therein. Moreover, assuming that the gap between the packages is small, the overall footprint of the proximity sensor module 100 may be substantially the same as the combined footprints of the packages 102 and 104 disposed therein. It should be noted that more packages besides 102 and 104 may be mounted within the proximity sensor module, depending on design, cost, size and other requirements.

Figure 6:
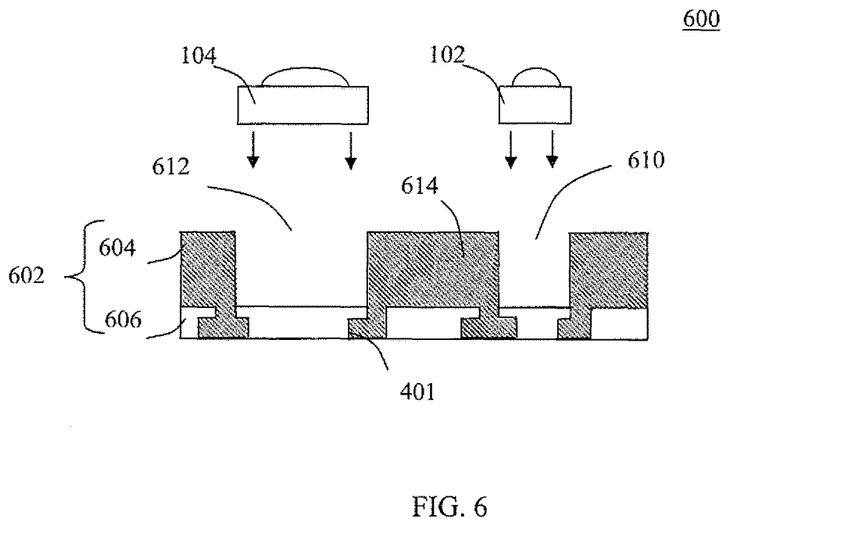
FIG. 6 illustrates a side cut-away view of a package-on-package proximity sensor module with a pre-molded lead frame during manufacturing.

FIG. 6 illustrates a side view of a package-on-package proximity sensor module 600 having a pre-molded lead frame 602. The proximity sensor module 600 may include a pre-molded lead frame 602 comprising a half-etched lead frame 606 moldably integrated with an IR cut mold compound housing 604. In one embodiment, the IR cut mold compound housing 604 may be molded over the half-etched lead frame 606 to form the pre-molded lead frame 602 first and both the infrared transmitter package 102 and the infrared receiver package 104 may subsequently be disposed on to the pre-molded lead frame 602 to form the proximity sensor module 600. In other words, the proximity sensor module 600 comprises of the integration of three fully assembled components, namely the pre-molded lead frame 602, the infrared transmitter package 102 and the infrared receiver 104, thereby the overall manufacturing process can be further simplified.

In one embodiment, as illustrated in FIG. 6, the pre-molded lead frame 602 may comprise a half-etched lead frame 606 moldably integrated with an IR cut compound housing 604, whereby IR cut mold compound housing 604 may include a first recess 610, a second recess 612 and a divider 614 disposed between the first recess 610 and the second recess 612. The infrared transmitter package 102 may be disposed on a first portion of the lead frame 606 and within the first recess 610. The infrared receiver package 104 may be disposed on a second portion of the lead frame 606 and within the second recess 612. In one embodiment, the IR cut mold compound housing 604 may be disposed over and integrated with the half-etched lead frame 606 by means of a molding process. In another embodiment, the IR cut mold compound housing 604 may be a pre-molded IR cut compound housing disposed over and fixedly attached to the half-etched lead frame whereby the pre-molded IR cut mold compound housing may be fixedly attached to the half-etched lead frame by an adhesive or a locking mechanism.

Similar to the embodiments described previously with respect to FIG. 4 and FIG. 5, the half-etched lead frame 106 may be a quad flat pack no-lead (QFN) lead frame. The etched region 401 of the lead frame 106 is covered with IR cut mold compound housing 604 to provide a locking feature (shown in FIG. 5 as element 502). The infrared transmitter package 102 and the infrared receiver package 104 may be operably mounted to the pre-molded lead frame 602 by means of solder ball and bump techniques using a chip surface mounting machine or a soldering machine. Similarly, the light emitted by the infrared transmitter package 102 may pass through the first aperture 610 towards the object (not shown) to be detected, reflected back by the object (not shown), and subsequently pass through the second aperture 612 towards the infrared receiver package 104. In one embodiment, the divider 614, which is part of the IR cut mold compound housing 604, forms a barrier between the infrared transmitter package 102 and the infrared receiver package 104, such that the infrared light that is internally reflected may be substantially attenuated or absorbed by the IR cut material contained therein, as described previously. In one embodiment, the molding process may include a transfer molding process, casting or any other suitable methods and processes may be employed to perform the same.

As the fabrication of the proximity sensor module 600 as illustrated in FIG. 6 may involve only the integration of the infrared transmitter package 102 and the infrared receiver package 104 on a pre-molded lead frame 602, the manufacturing process may be further simplified. Thus the overall manufacturing cost may be further reduced.

Figure 7:
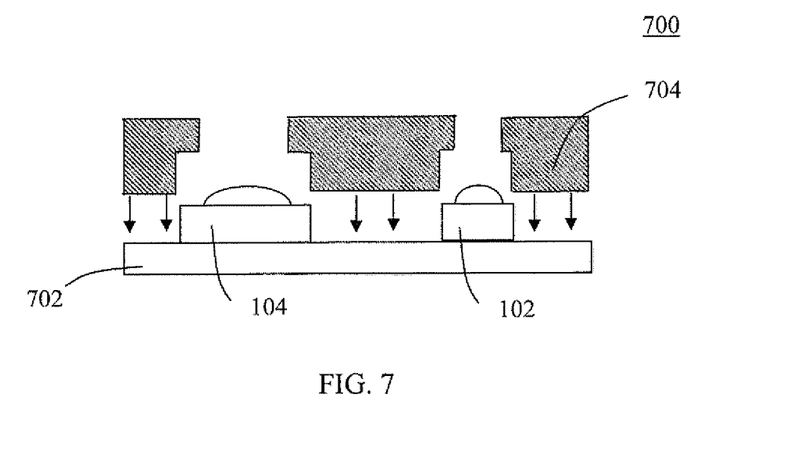
FIG. 7 illustrates a side cut-away view of a package-on-package proximity sensor module with a pre-fabricated casing during manufacturing.

FIG. 7 illustrates a side view of a package-on-package proximity sensor module having a pre-fabricated easing which may be premolded or pre-formed using a IR cut mold compound as illustrated previously. In one embodiment, the proximity sensor module 700 may include a fully assembled infrared transmitter package 102 and a fully assembled infrared receiver package 104 disposed on a lead frame 702 and subsequently covered by a pre-fabricated IR cut compound casing 704. In one embodiment, the pre-fabricated IR cut compound casing 704 may be disposed over and fixedly attached to the lead frame 702 having a fully assembled infrared transmitter package 102 and a fully assembled infrared receiver package 104 attached therewith The pre-fabricated IR cut compound casing 704 may be fixedly attached to the lead frame 702 by adhesive means (not shown) or some locking mechanism. All functionality, as well as the features, of all other components are similar to those that have previously been described. Therefore, for simplicity purposes, no further explanation will be provided in this section.

Figure 8:
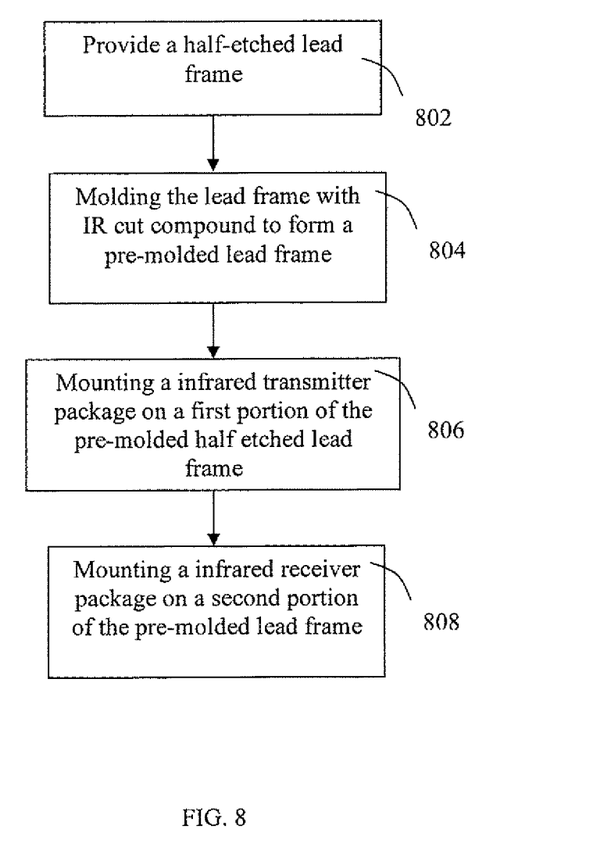
FIG. 8 illustrates a flow chart of various steps according to one method of fabricating a package-on-package proximity sensor module.

FIG. 8 illustrates a flowchart of a method of fabricating a package-on-package proximity sensor module. Beginning at step 802, a half-etched lead frame is provided. At step 804 an IR cut compound is molded over the half-etched lead frame by a molding process to form a pre-molded lead frame. The pre-molded lead frame comprising a half-etched lead frame integrated with an IR cut compound housing, wherein the housing may include a first recess, a second recess and a divider disposed between the first recess and the second recess. At step 806, an infrared transmitter package is mounted on a first portion of the lead frame within the first recess of the housing. At step 808, a infrared receiver package is mounted on a second portion of the lead frame within the second recess of the housing.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A package-on-package proximity sensor module comprising:
    a fully-assembled infrared transmitter package including an infrared transmitter die, a transmitter lead frame and a first transparent compound, the infrared transmitter die being electrically connected to the transmitter lead frame, the infrared transmitter die being covered by the first transparent compound;
    a fully-assembled infrared receiver package including a proximity sensor detector, a receiver lead frame and a second transparent compound, the proximity sensor detector being electrically connected to the receiver lead frame, the proximity sensor detector being covered by the second transparent compound;
    a half-etched lead frame including etched regions, the thickness of the etched regions of the half-etched lead frame being thinner than the thickness of non-etched regions of the half-etched lead frame, wherein the fully-assembled infrared transmitter package is mounted on a first portion of the half-etched lead frame that includes at least some of the etched regions so that the transmitter lead frame is electrically connected to the half-etched lead frame and the fully-assembled infrared receiver package is mounted on a second portion of the half-etched lead frame that includes at least some of the etched regions so that the receiver lead frame is electrically connected to the half-etched lead frame; and
    an infrared (IR) cut mold compound, wherein the IR cut mold compound covers the fully-assembled infrared transmitter package, the fully-assembled infrared receiver package, and a portion of the half-etched lead frame.

2. The proximity sensor module of claim 1, wherein the transmitter lead frame includes an etched region, the thickness of the etched region of the transmitter lead frame being thinner than the thickness of a non-etched region of the transmitter lead frame.

3. The proximity sensor module of claim 2, wherein the fully-assembled infrared transmitter package further comprises a lens molded from a transparent compound and wherein the infrared transmitter die is an LED die.

4. The proximity sensor module of claim 1, wherein the receiver lead frame includes an etched region, the thickness of the etched region of the receiver lead frame being thinner than the thickness of a non-etched region of the receiver lead frame.

5. The proximity sensor module of claim 4, wherein the fully-assembled infrared receiver package further comprises a lens molded from the second transparent compound and an ASIC and wherein the proximity sensor detector is a photo-diode die.

6. The proximity sensor module of claim 1, wherein the half-etched, lead frame is a quad flat pack no-lead (QFN) lead frame.

7. The proximity sensor module of claim 6, wherein a bottom surface of the half-etched, lead frame is etched and covered with the IR cut mold compound to provide a locking feature.

8. The proximity sensor module of claim 1, wherein the IR cut mold compound is disposed via a molding process over and covering both the fully-assembled infrared transmitter package and the fully-assembled infrared receiver package, and wherein the IR cut mold compound further comprises a first aperture above the fully-assembled infrared transmitter package and a second aperture above the fully-assembled infrared receiver package, respectively.

9. The proximity sensor module of claim 1, wherein the IR cut mold compound further comprises a moldable material, an epoxy, and an IR cut material.

10. A package-on-package proximity sensor module comprising:
    an infrared transmitter package including an infrared transmitter die, a transmitter lead frame and a first transparent compound, the infrared transmitter die being electrically connected to the transmitter lead frame, the infrared transmitter die being covered by the first transparent compound;
    an infrared receiver package including a proximity sensor detector, a receiver lead frame and a second transparent compound, the proximity sensor detector being electrically connected to the receiver lead frame, the proximity sensor detector being covered by the second transparent compound; and
    a pre-molded lead frame comprising a half-etched lead frame moldably integrated with an infrared (IR) cut compound housing, the half-etched lead frame including etched regions, the thickness of the etched regions of the half-etched lead frame being thinner than the thickness of non-etched regions of the half-etched lead frame, wherein the IR cut compound housing comprises a first recess, a second recess and a divider disposed between the first recess and the second recess, and wherein the infrared transmitter package is mounted on a first portion of the lead frame that includes at least some of the etched regions within the first recess so that the transmitter lead frame is electrically connected to the half-etched lead frame and the infrared receiver package is mounted on a second portion of the lead frame that includes at least some of the etched regions within the second recess so that the receiver lead frame is electrically connected to the half-etched lead frame.

11. The proximity sensor modules of claim 10, wherein the infrared transmitter package is a fully-assembled lead frame package comprising a lens molded of a transparent compound and wherein the infrared transmitter die is an LED die.

12. The proximity sensor module of claim 10, wherein the infrared receiver package is a fully-assembled lead frame package comprising a lens molded of a transparent compound and an ASIC and wherein the proximity sensor detector is a photo-diode die.

13. The proximity sensor module of claim 10, wherein the pre-molded lead frame is a quad flat pack no-lead (QFN) lead frame.

14. The proximity sensor module of claim 10, wherein the IR cut mold compound housing comprises an IR cut mold compound, wherein that the mold compound is disposed over and integrated with the lead frame by a molding process.

15. The proximity sensor module of claim 10, wherein a bottom surface of the pre-molded lead frame is etched and covered with a portion of the IR cut mold compound of the IR cut mold compound housing, configured to provide a locking feature between the half-etched lead frame and the IR cut mold compound housing.

16. The proximity sensor module of claim 10, wherein the IR cut mold compound housing comprises a pre-molded IR cut compound housing disposed over and fixedly attached to the half-etched lead frame.

17. The proximity sensor module of claim 16, wherein the pre-molded IR cut mold compound housing is fixedly attached to the half-etched lead frame by an adhesive or a locking mechanism.

18. The proximity sensor module of claim 10, wherein the molded IR cut compound housing further comprises a moldable material, an epoxy, and an IR cut additive.

19. A package-on-package proximity sensor module comprising:
- a fully-assembled, infrared transmitter package including an infrared transmitter die, a transmitter lead frame and a first transparent compound, the infrared transmitter die being electrically connected to the transmitter lead frame, the infrared transmitter die being covered by the first transparent compound, wherein the transmitter lead frame includes an etched region, the thickness of the etched region of the transmitter lead frame being thinner than the thickness of a non-etched region of the transmitter lead frame;
- a fully-assembled, infrared receiver package including a proximity sensor detector, a receiver lead frame and a second transparent compound, the proximity sensor detector being electrically connected to the receiver lead frame, the proximity sensor detector being covered by the second transparent compound, wherein the receiver lead frame includes an etched region, the thickness of the etched region of the receiver lead frame being thinner than the thickness of a non-etched region of the receiver lead frame;
- a half-etched quad flat pack no-lead (QFN) lead frame including etched regions, the thickness of the etched regions of the half-etched OFN lead frame being thinner than the thickness of non-etched regions of the half-etched QFN lead frame; and
- a pre-fabricated infrared (IR) cut compound casing moldably integrated with the half-etched QFN lead frame, wherein the pre-molded IR cut compound casing comprises a first recess, a second recess and a divider disposed between the first recess and the second recess, wherein the infrared transmitter package is mounted on a first portion of the half-etched QFN lead frame that includes at least some of the etched regions within the first recess so that the transmitter lead frame is electrically connected to the half-etched QFN lead frame and the infrared receiver package is mounted on a second portion of the half-etched QFN lead frame that includes at least some of the etched regions within the second recess so that the receiver lead frame is electrically connected to the half-etched QFN lead frame, and, wherein the pre-molded IR cut compound casing is fixedly attached to the half-etched QFN lead frame by an adhesive or a locking mechanism.

20. The proximity sensor module of claim 19, wherein the fully-assembled infrared receiver package comprises a lens molded of a clear compound and an ASIC and wherein the proximity sensor detector is a photo-diode die.

* * * * *